United States Patent
Zeng et al.

(10) Patent No.: US 12,149,143 B2
(45) Date of Patent: Nov. 19, 2024

(54) MAGNETIC LEVITATION PLANAR MOTOR WORKBENCH HAVING DOUBLE-LAYER WINDING OF COARSE AND FINE DRIVE

(71) Applicant: HUAZHONG UNIVERSITY OF SCIENCE AND TECHNOLOGY, Hubei (CN)

(72) Inventors: Lizhan Zeng, Hubei (CN); Kai Liu, Hubei (CN); Xuedong Chen, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/679,469

(22) Filed: May 31, 2024

(65) Prior Publication Data
US 2024/0322663 A1 Sep. 26, 2024

Related U.S. Application Data

(63) Continuation of application No. PCT/CN2022/123698, filed on Oct. 4, 2022.

(30) Foreign Application Priority Data

May 23, 2022 (CN) .......................... 202210563843.7

(51) Int. Cl.
*H02K 41/03* (2006.01)
*H01L 21/68* (2006.01)
*H02N 15/00* (2006.01)

(52) U.S. Cl.
CPC ........... *H02K 41/031* (2013.01); *H01L 21/68* (2013.01); *H02N 15/00* (2013.01); *H02K 2201/18* (2013.01)

(58) Field of Classification Search
CPC ... H02K 41/031; H02K 2201/10; H02N 15/00
See application file for complete search history.

(56) References Cited

U.S. PATENT DOCUMENTS

| 10,541,596 B2* | 1/2020 | Ding ................... G03F 7/70758 |
| 2021/0132511 A1* | 5/2021 | Ding .................. H02K 41/0356 |

FOREIGN PATENT DOCUMENTS

| CN | 101527484 | 9/2009 |
| CN | 102097982 | 6/2013 |

(Continued)

OTHER PUBLICATIONS

"International Search Report (Form PCT/ISA/210) of PCT/CN2022/123698," mailed on Dec. 22, 2022, with English translation thereof, pp. 1-4.

(Continued)

*Primary Examiner* — Daniel C Puentes
*Assistant Examiner* — Minki Chang
(74) *Attorney, Agent, or Firm* — JCIPRNET

(57) ABSTRACT

The disclosure discloses a magnetic levitation planar motor workbench having a double-layer winding of coarse and fine drive, which belongs to the technical field of planar motors, and includes a stator and a mover. The vertically magnetized permanent magnets and the horizontally magnetized permanent magnets in the stator are arranged in a Halbach arrangement; the mover is located on the enhanced side of the air gap magnetic field above the stator. The mover adopts the double-layer winding of unequal heights, and the height of the upper first winding is smaller than the lower second winding. Each layer of winding may generate driving forces in six directions to achieve six-degree-of-freedom driving.

10 Claims, 10 Drawing Sheets

(56) References Cited

FOREIGN PATENT DOCUMENTS

| | | | |
|---|---|---|---|
| CN | 203520012 | 4/2014 | |
| CN | 103592824 | 4/2015 | |
| CN | 204271955 | 4/2015 | |
| CN | 114825854 | 7/2022 | |
| JP | H0917847 | 1/1997 | |
| WO | WO-2013112761 A2 * | 8/2013 | ......... G03F 7/70758 |

OTHER PUBLICATIONS

"Written Opinion of the International Searching Authority (Form PCT/ISA/237) of PCT/CN2022/123698," mailed on Dec. 22, 2022, with English translation thereof, pp. 1-10.

* cited by examiner

MAGNETIC LEVITATION PLANAR MOTOR WORKBENCH HAVING DOUBLE-LAYER WINDING OF COARSE AND FINE DRIVE

CROSS-REFERENCE TO RELATED APPLICATION

This application is a continuation of international application of PCT application serial no. PCT/CN2022/123698, filed on Oct. 4, 2022, which claims the priority benefit of China application no. 202210563843.7, filed on May 23, 2022. The entirety of each of the above-mentioned patent applications is hereby incorporated by reference herein and made a part of this specification.

BACKGROUND

Technical Field

The disclosure belongs to the technical field of planar motors, and particularly relates to a magnetic levitation planar motor workbench having a double-layer winding of coarse and fine drive.

Description of Related Art

With the development of nano-precision processing equipment technology represented by integrated circuits, micro-electromechanical systems, and space optical elements, higher requirements are placed on the stroke, acceleration, and positioning precision of the motion platform. As the key equipment in the IC manufacturing process, the lithography machine integrates multiple cutting-edge technologies such as light, electricity, magnetism, and heat, in which the magnetic levitation planar motor, as the core component of the next-generation lithography machine, can achieve precise operation and control over a long stroke.

In the field of semiconductor manufacturing, conventional ultra-precision workbenches usually use macro-micro drives, and conventional multi-degree-of-freedom motion platforms usually use a variety of actuators, such as air bearings, ball screws, linear motors, piezoelectric ceramics, and flexible hinges. During the processing and assembly stages, the motion characteristics are inevitably affected due to the existence of manufacturing tolerances and assembly errors. At the same time, due to the need for ventilation and friction damping during the working stage, the scope of use is significantly limited, and there is usually a disadvantage of complex structure. For example, in the patent "A two-degree-of-freedom high-precision long-stroke air bearing workpiece platform, CN103592824B" although long-stroke motion and high-precision positioning are achieved, the patent requires marble with a high degree of flatness as an air bearing guide rail and a linear motor to provide two degrees of freedom of motion. On the other hand, the magnetic levitation planar motor can achieve the six-degree-of-freedom motion control goal by using the Lorentz force, which has a simple structure, high integration, vacuum compatibility, low friction, no need for lubrication, and long stroke, and has become a key research direction.

The magnetic levitation planar motor utilizes the Lorentz force generated from the magnetic field of the current-carrying conductor to provide driving force and driving torque. Therefore, in order to achieve high-acceleration and high-speed precision motion control, higher requirements are placed on the fluctuation range of the driving force thereof. For example, the patent "A permanent magnet synchronous magnetic levitation planar motor, CN102097982B" optimizes the design of the permanent magnet array, and the permanent magnets thereof have various shapes and different magnetization directions. However, in the actual processing process, the processing of irregular-shaped permanent magnets is difficult, which puts high demands on the adhesive process, is not likely to generate a magnetic field distribution with good sinusoidal characteristics, and the output force fluctuates greatly during the motion, thereby poor stability, large tracking errors, and low positioning precision are caused.

Therefore, how to reduce the output force fluctuation of the magnetic levitation planar motor during the motion process and improve the motion control precision has become a technical problem in this field.

SUMMARY

In view of the above defects or improvement needs of the related art, the disclosure provides a magnetic levitation planar motor workbench having a double-layer winding of coarse and fine drive, and the purpose is to reduce the output force fluctuation of the magnetic levitation planar motor during the motion process and improve the motion precision through the design of double-layer windings of unequal heights in the mover and the two-dimensional permanent magnet array in the stator, thereby the technical problem of large output force fluctuation in the existing magnetic levitation planar motor during the motion process is solved.

To achieve the above purpose, the disclosure provides technical solutions as follows. A magnetic levitation planar motor workbench having a double-layer winding of coarse and fine drive is provided, and the workbench includes a stator and a mover.

The stator includes a base, and a plurality of vertically magnetized permanent magnets and a plurality of horizontally magnetized permanent magnets arranged in a groove of the base in a Halbach arrangement.

The mover is located on the enhanced side of the magnetic field generated by the stator; the mover includes a first winding and a second winding stacked under the first winding, and the height of the first winding is smaller than the height of the second winding; both the first winding and the second winding include a plurality of coils capable of generating driving forces in two directions after being energized, so that the first winding and the second winding each have a six-degree-of-freedom driving force and a driving torque; a contour shape of the mover is in a square shape or a semi-square shape. The semi-square shape means that the aspect ratio of the smallest rectangle that can accommodate the contour of the mover is range from 0.9 to 1.1.

Preferably, the height ratio of the first winding to the second winding is range from 0.2 to 0.6.

Preferably, the first winding includes four groups of first single-phase windings arranged in 2 rows and 2 columns, the first single-phase winding includes a rectangular coils arranged in parallel at equal intervals, and the long sides of the rectangular coils of every two adjacent groups of first single-phase windings are perpendicular to each other.

The second winding has the same structure as the first winding and differs only in height, and the rectangular coils in the first winding and the rectangular coils in the second winding are stacked up and down in a one-to-one correspondence, in which in the upper and lower rectangular coils, the long sides are aligned and the short sides are aligned, so that the upper and lower rectangular coils are aligned completely.

Preferably, the first winding includes three groups of second single-phase windings, the second single-phase winding includes b rectangular coils sequentially stacked in a step-shape manner, one group of the second single-phase windings is placed flat in the middle, and the other two groups of the second single-phase windings are respectively placed vertically at the upper left and lower right steps of the second single-phase winding in middle and are attached with the second single-phase winding step connection in middle.

The second winding has the same structure as the first winding but differs in height, and the orientation of the first winding rotated 90° Counterclockwise around the center thereof is the orientation of the second winding.

Preferably, the first winding includes c rows, each row has d rectangular coils, the short sides of adjacent rectangular coils in each row are connected, and adjacent rows are staggered left and right.

The second winding has the same structure as the first winding but differs in height, and the long sides of the rectangular coils in the first winding and the long sides of the rectangular coils in the second winding are perpendicular to each other.

Preferably, the long sides of the rectangular coils in the first winding and the second winding are all at an angle of 45°±1° to catheti of the vertically magnetized permanent magnets.

Preferably, both the first winding and the second winding include circular coils in e rows and e columns, and the circular coils in the first winding and the second winding are stacked up and down in concentric circles in a one-to-one correspondence.

Preferably, in the first single-phase winding, the length of the long side of the rectangular coil is four times the pole pitch, and the center distance between adjacent rectangular coils is 4/3 times the pole pitch.

Preferably, the workbench further includes a vacuum cover, and the mover is disposed inside the vacuum cover.

Preferably, the vertically magnetized permanent magnet is in a square shape, and the horizontally magnetized permanent magnet is in a rectangular shape.

The above a, b, c, d, and e are all positive integers greater than 1.

In general, the above technical solutions conceived by the disclosure can achieve the following beneficial effects compared with the related art.

1. In the magnetic levitation planar motor workbench having the double-layer winding of coarse and fine drive provided by the disclosure, the stator comprise a plurality of vertically magnetized permanent magnets and a plurality of horizontally magnetized permanent magnets arranged in a Halbach arrangement to form a permanent magnet array structure, so that the magnetic field above the permanent magnet is enhanced and the magnetic field below is weakened. The mover is located on the enhanced side of the air gap magnetic field above the stator. The mover adopts a double-layer winding with unequal heights, namely the first winding and the second winding. The first winding is located above the second winding and is smaller in height than the second winding. Both the first winding and the second winding contain multiple coils with driving forces in two directions after being energized, and each coil may generate driving forces in two directions. After the first winding and the second winding are energized and decoupled through current, the windings interact with the air gap magnetic field generated by the stator permanent magnet array and both of the windings may generate driving force and driving torque in six directions to achieve six-degree-of-freedom driving. In the speed-changing motion stage, the lower second winding generates a larger driving force to achieve acceleration and deceleration motion, thus achieving high acceleration and low-precision motion control; in the uniform-speed linear motion stage, the upper first winding generates a driving force with high precision and less fluctuation to achieve uniform-speed motion, and the goal of high-speed and high-precision motion control is achieved through the coarse and fine drive solution. The double-layer winding structure can reduce output force fluctuation during the motion process, improve motion precision, and has good workbench stability, small tracking error, and high positioning precision, thereby reliable technical support for ultra-precision manufacturing fields such as semiconductor processing is provided.

2. In the magnetic levitation planar motor workbench having the double-layer winding of coarse and fine drive provided by the disclosure, through adopting the double-layer winding of unequal heights to introduce different currents in different motion stages to provide the target driving force, which can effectively facilitate coil heat dissipation and coil heating is prevented from affecting structural characteristics and reducing motion precision.

3. In the magnetic levitation planar motor workbench having the double-layer winding of coarse and fine drive provided by the disclosure, the range of the height ratio $h_{ration}$ of the first winding and the second winding in the double-layer winding structure is designed to be within [0.2, 0.6]. When the height ratio is within this range, the coil in the upper first winding is not forced to introduce a large current to generate the desired force and torque due to the low magnetic field intensity, causing the coil to heat up too much; at the same time, compared with the coil in the lower second winding, the high-order harmonic content of the magnetic field intensity at the coil in the upper first winding is lower, and the generated driving force and driving torque fluctuate less, which is beneficial to achieving the goal of smooth motion control.

4. In the magnetic levitation planar motor workbench having the double-layer winding of coarse and fine drive provided by the disclosure, four first/second winding coil topology structures are provided, that is, the disclosure provides four specific implementation solutions of the magnetic levitation planar motor workbench, which has a simple structure and is easy to implement and apply.

5. In the magnetic levitation planar motor workbench having the double-layer winding of coarse and fine drive provided by the disclosure, the Lorentz force generated by the magnetic field of the current-carrying conductor is utilized, which can be directly used to drive motion components to move without lubrication and there is no friction, the vacuum cover installed on the outside of the mover makes the workbench vacuum compatible while avoiding the influence of coil heating.

DESCRIPTION OF THE EMBODIMENTS

In order to make the purpose, technical solutions, and advantages of the disclosure more comprehensible, the disclosure is further described in detail below together with the accompanying drawings and embodiments. It should be understood that the specific embodiments described herein are only used to illustrate the disclosure, and the embodiments are not used to limit the disclosure. In addition, the technical features involved in the various embodiments of the disclosure described below may be combined with each other as long as the features do not conflict with each other.

The disclosure provides a six-degree-of-freedom magnetic levitation planar motor workbench having a double-layer winding of coarse and fine drive, which is a double-layer winding planar motor structure having of coarse and fine drive functions and is mainly used in the field of semiconductor manufacturing.

EXAMPLE 1

Figure 1:
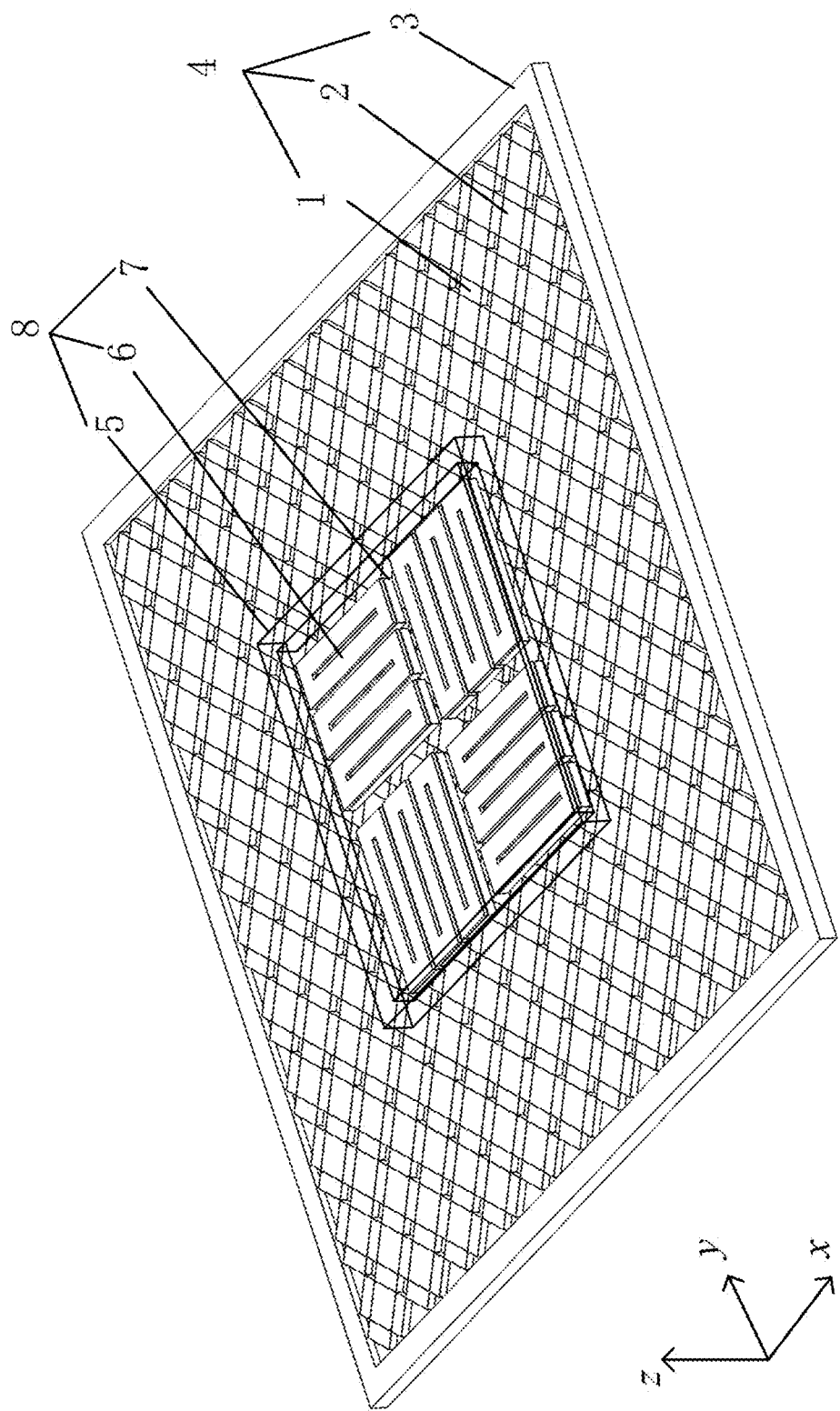
FIG. 1 is a three-dimensional schematic diagram of a magnetic levitation planar motor workbench having a double-layer winding of coarse and fine drive in Example 1 of the disclosure.

As shown in FIG. 1, the six-degree-of-freedom magnetic levitation planar motor workbench having the double-layer winding of coarse and fine drive provided in this embodiment includes a stator 4 and a mover 8.

Figure 2:
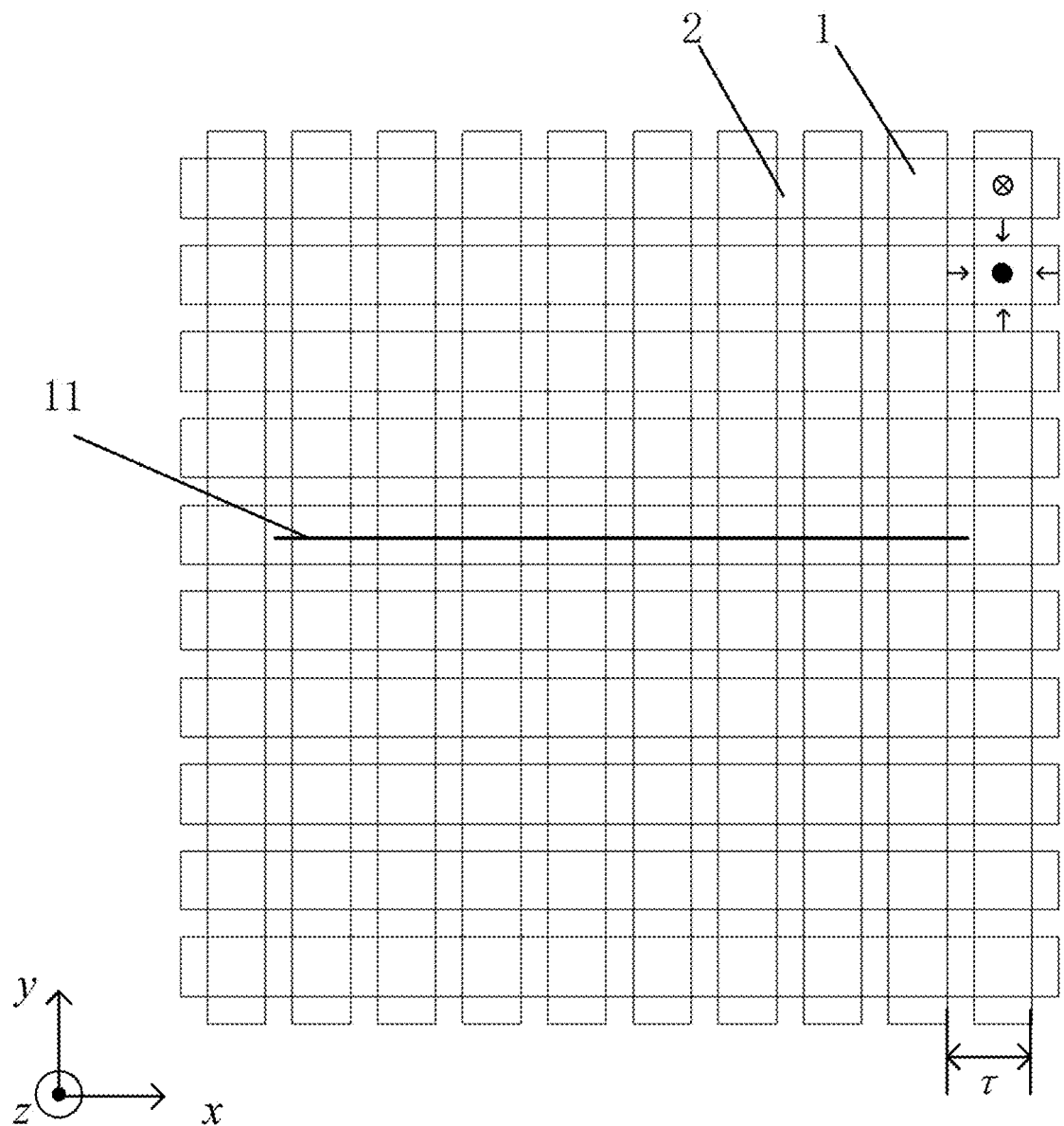
FIG. 2 is a top view of a permanent magnet array structure and auxiliary lines of a stator in Example 1 of the disclosure.

The stator 4 includes a plurality of vertically magnetized permanent magnets 1, a plurality of horizontally magnetized permanent magnets 2, and a base 3, in which the plurality of vertically magnetized permanent magnets 1 and the plurality of horizontally magnetized permanent magnets 2 are arranged in a Halbach arrangement to form a permanent magnet array structure, so that the magnetic field above the permanent magnets is enhanced and the magnetic field below is weakened. Therefore, the mover 8 is arranged above the permanent magnet array. The magnetization directions of the vertically magnetized permanent magnet 1 and the horizontally magnetized permanent magnet 2 are shown by arrows in FIG. 2. The vertically magnetized permanent magnet 1 and the horizontally magnetized permanent magnet 2 are fixed in the groove of the base 3 by, for example, bonding.

The vertically magnetized permanent magnet 1 is preferably in a square shape, and the horizontally magnetized permanent magnet 2 is preferably in a rectangular shape. As may be seen from FIG. 2, the four arrows around the square vertically magnetized permanent magnet 1 all point to the vertically magnetized permanent magnet 1 magnetized along the +z axis, and are away from the vertically magnetized permanent magnet 1 magnetized along the -z axis. According to the magnetic field characteristics of the Halbach array, the +z axis direction is the magnetic field enhanced side, that is, above the stator 4. The mover 8 is located on the enhanced side of the air gap magnetic field. The mover 8 includes a vacuum cover 5, a first winding 6, and a second winding 7. The first winding is farther from the permanent magnet array structure, and the second winding is closer to the permanent magnet array. The height of the first winding 6 is smaller than the height of the second winding 7.

Figure 3:
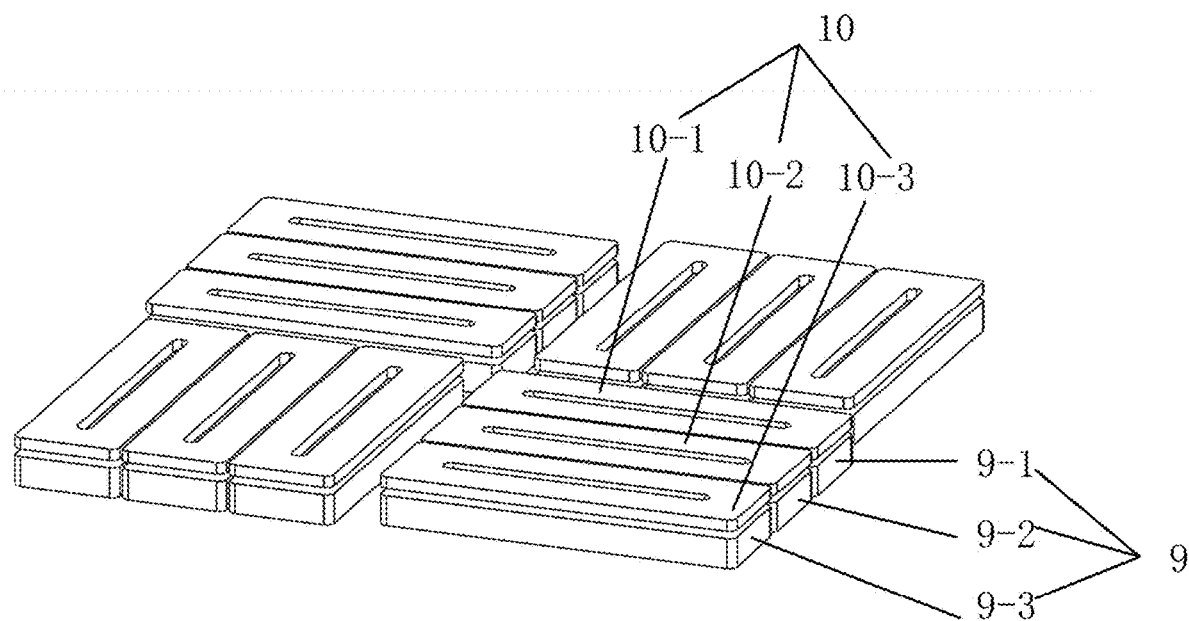
FIG. 3 is an isometric view of a double-layer winding of a mover in Example 1 of the disclosure.

As shown in FIG. 3, the second winding 7 includes four groups of lower single-phase windings 9 arranged in 2 rows and 2 columns, namely, four groups of first single-phase windings.

Each lower single-phase winding 9 comprises a first coil 9-1, a second coil 9-2, and a third coil 9-3, all of which are rectangular coils and are arranged at equal intervals, the long sides of the coils of every two adjacent groups of lower single-phase windings 9 are perpendicular to each other, so the second winding 7 comprises 12 coils in total, and the overall arrangement is in a "windmill-type" manner.

The first winding 6 is located directly above the second winding 7. The first winding 6 and the second winding 7 have the same structure and only differ in height. Specifically, the first winding 6 includes four groups of upper single-phase windings 10 arranged in 2 rows and 2 columns, namely, four groups of first single-phase windings. Each upper single-phase winding 10 comprises a fourth coil 10-1, a fifth coil 10-2, and a sixth coil 10-3, all of which are rectangular coils and are arranged at equal intervals, the long sides of the coils of every two adjacent groups of upper single-phase windings 10 are perpendicular to each other, so the first winding 6 comprises 12 coils in total, and the overall arrangement is in a "windmill-type" manner.

The rectangular coil in the first winding 6 and the rectangular coil in the second winding 7 are stacked one by one, and the upper and lower coils have different heights, that is, the first winding 6 and the second winding 7 have different heights. The height of each coil in the first winding 6 is denoted as $h_1$, the height of each coil in the second winding 7 is denoted as $h_2$, and the expression of the height ratio $h_{ration}$ is as follows:

$$h_{ration} = \frac{h_1}{h_2} \quad (1)$$

The range of $h_{ration}$ is preferably [0.2, 0.6]. When the height ratio is within this range, the coil in the upper first winding is not forced to introduce a large current to generate the desired force and torque due to the low magnetic field intensity, causing the coil to heat up too much; at the same time, compared with the coil in the lower second winding, the high-order harmonic content of the magnetic field intensity at the coil in the upper first winding is lower, and the generated driving force and driving torque fluctuate less, which is beneficial to achieving the goal of smooth motion control.

The long sides of the rectangular coils in the first winding 6 and the second winding 7 are both at an angle of 45°±1° to the right-angled side of the vertically magnetized permanent magnet 1. The 45°±1° angle is designed to facilitate the decoupling of the air gap magnetic field, the magnetic field intensity component $B_x$ of the air gap magnetic field along the x axis after rotation is only related to the x axis position, the magnetic field intensity component $B_y$ along the y axis is only related to the y axis position, and the fundamental components of $B_x$ and $B_y$ are sinusoidally distributed along the corresponding axes.

The rectangular coils in the lower single-phase winding 9 and the upper single-phase winding 10 are preferably rectangular coreless coils. The long side of the rectangular coil is preferably four times the pole pitch, and the center distance of adjacent rectangular coils is preferably 4/3 times the pole pitch, which is beneficial to suppressing the coupling between the driving force and driving torque generated by the short side, thereby decoupling calculation is conveniently realized.

The contour shape of the mover 8 is in a square shape or a semi-square shape. The semi-square shape means that the aspect ratio of the smallest rectangle that may accommodate the surrounding contours of the mover is range from 0.9 to 1.1. The centrosymmetric structure is not likely to cause deflection torque, which is beneficial to reducing the directional dependence of the planar motor. The centrosymmetric structure includes a structure that is approximately rotationally symmetric structure.

The mover 8 is disposed in the vacuum cover 5, so that the mover 8 may work in a vacuum environment and avoid the mover coil radiating heat to the stator permanent magnet array structure and affecting the magnetic field distribution.

EXAMPLE 2

The difference between this embodiment and the Example 1 is that the arrangement of the rectangular coils in the first winding 6 and the second winding 7 of the mover is different, and the relative positions of the first winding 6 and the second winding 7 are different. The other structures and connections are the same as in Example 1. Specifically, details are as follows.

Figure 4:
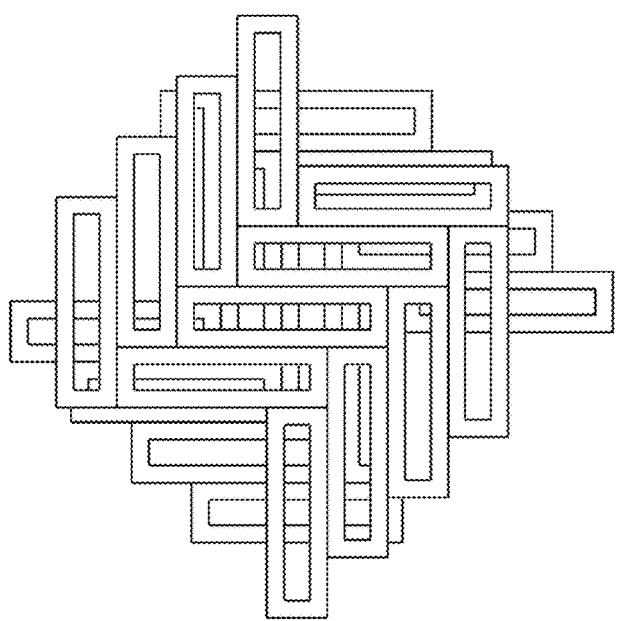
FIG. 4 is a top view of a double-layer winding of a mover in Example 2 of the disclosure.

As shown in FIG. 4, in this embodiment, the first winding 6 includes three groups of second single-phase windings, each of which includes four rectangular coils stacked in a step-shape manner, one group of second single-phase windings is placed flat in the middle, and the other two groups of second single-phase windings are respectively placed vertically at the upper left and lower right steps of the second single-phase winding in the middle, and the windings are attached with the step connections of the second single-phase winding in the middle. The long sides of the rectangular coils of the second single-phase windings on two sides are perpendicular to the long sides of the rectangular coil of the second single-phase winding in the middle.

The second winding 7 has the same structure as the first winding 6 but different thickness. An orientation of the first winding 6 rotated 90° Counterclockwise around the center thereof is the orientation of the second winding 7. The overall structure of the mover is similar to a "fishbone shape".

EXAMPLE 3

The difference between this embodiment and Example 1 is that the arrangement of the rectangular coils in the first winding 6 and the second winding 7 of the mover is different, and the relative positions of the first winding 6 and the second winding 7 are different. The other structures and connections are the same as in Example 1. Specifically, details are as follows.

Figure 5:
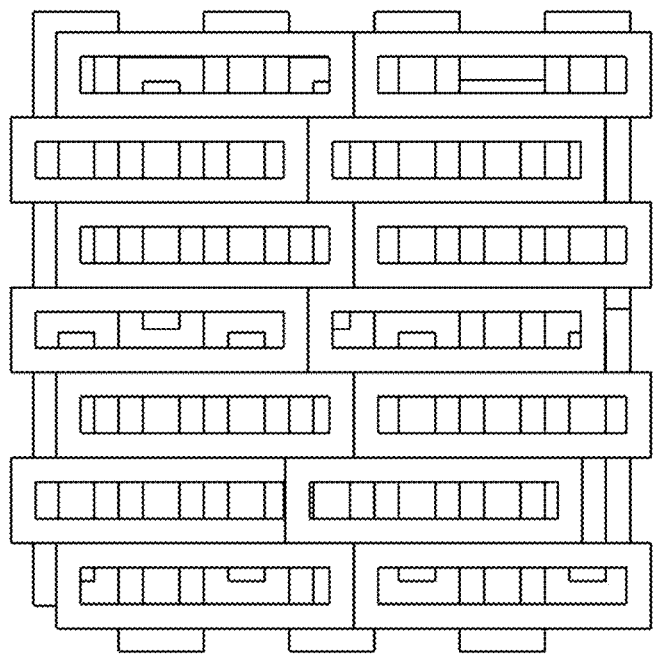
FIG. 5 is a top view of a double-layer winding of a mover in Example 3 of the disclosure.

As shown in FIG. 5, in this embodiment, the first winding 6 includes 7 rows, 2 rectangular coils in each row, the short sides of adjacent rectangular coils in each row are connected, a rectangular coil in a row may be concentric with another rectangular coil after translation along the long side direction, and adjacent rows are staggered left and right.

The second winding 7 has the same structure as the first winding 6 but different thicknesses. The long side of the rectangular coil in the first winding 6 and the long side of the rectangular coil in the second winding 7 are perpendicular to each other. The first winding 6 and the second winding 7 are arranged similarly to an "orthogonal shape".

EXAMPLE 4

The six-degree-of-freedom magnetic levitation planar motor workbench having the double-layer winding of coarse and fine drive provided in this embodiment includes the stator 4 and the mover 8. The structure of the stator 4 is the same as in Example 1 to Example 3.

The mover 8 is located on the enhanced side of the air gap magnetic field. The mover 8 includes the vacuum cover 5, the first winding 6, and the second winding 7. The first winding 6 is located directly above the second winding 7.

Figure 6:
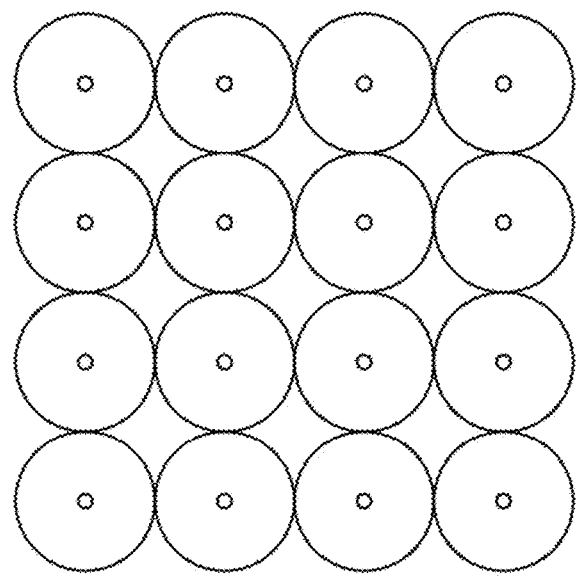
FIG. 6 is a top view of a double-layer winding of a mover in Example 4 of the disclosure.

As shown in FIG. 6, in this embodiment, the first winding 6 includes 4 rows*4 columns of circular coils, and the circular coils in the first winding 6 and the second winding 7 are stacked in upper and lower concentric circles in a one-to-one correspondence.

The first winding 6 and the second winding 7 have the same structure and only differ in height. The range of the ratio $h_{ration}$ of the height $h_1$ of the first winding 6 to the height $h_2$ of the second winding 7 is the same as in Example 1 to Example 3.

The mover 8 is disposed in the vacuum cover 5, so that the mover 8 may work in a vacuum environment and avoid the mover coil radiating heat to the stator permanent magnet array structure and affecting the magnetic field distribution characteristics.

In the magnetic levitation planar motor workbench having the double-layer winding of coarse and fine drive provided in Examples 1 to 4 of the disclosure, all of the stators comprise the plurality of vertically magnetized permanent magnets 1 and the plurality of horizontally magnetized permanent magnets 2 arranged in a Halbach arrangement to form a permanent magnet array structure. Compared with the one-dimensional arrangement similar to linear motors, the magnetic field generated by the permanent magnet array structure in the two-dimensional arrangement of the disclosure can achieve motion in both the directions of x and y, which is beneficial to expanding the motion range of the planar motor.

The movers all have double-layer windings, which are all located on the magnetic field enhanced side, in which the winding farther from the permanent magnet array structure is the first winding, and the winding closer to the permanent magnet array is the second winding, and the height of the first winding is smaller than the height of the second winding. In Example 1 to Example 4, a total of 4 first/second winding coil topologies are provided, in which the "windmill-shaped" coil topology structure of Example 1 has the lowest directional dependence, the "fishbone-shaped" coil topology structure of Example 2 has the lowest power consumption, and the "concentric circular" coil topology structure of Example 4 has higher symmetry.

After the first winding and the second winding are energized, the windings interact with the air gap magnetic field generated by the stator permanent magnet array, and may generate driving force and driving torque in six directions. Since the magnetic field intensity above the permanent magnet array is distributed periodically, according to the Fourier series method analysis, it may be seen that the magnetic field may be regarded as a combination of fundamental waves and harmonic waves.

As the air gap magnetic field height increases, the fundamental wave accounts for a larger proportion and the harmonic wave accounts for a smaller proportion. In the process of current decoupling, in order to reduce the calculation time and increase the system control frequency, the fundamental component of the magnetic field intensity is usually used to calculate the driving force and the driving force resistance, and then the current required to be introduced into each coil is allocated. Due to the existence of magnetic field harmonics, the driving force and driving torque fluctuate, and the system positioning precision and tracking performance are affected.

Therefore, the mover of the disclosure adopts a double-layer winding arrangement, and the second winding of the lower layer serves as a "macro-motion stage" to provide a larger driving force and driving torque during the speed-changing motion stage, so that the mover moves quickly to the target position. The first winding on the upper layer serves as a "micro-motion stage" to provide driving force and driving torque with small fluctuations in the uniform-speed linear stage. The driving force and driving torque are precisely compensated according to the feedback signal to achieve high-speed and high-precision motion control.

The mover of the disclosure adopts a double-layer winding arrangement, which can reduce output force fluctuation during the motion process, improve motion precision, and provide reliable technical support for ultra-precision manufacturing fields such as semiconductor processing.

The following experimental analysis is conducted to further verify the use effect of the magnetic levitation planar motor workbench having the double-layer winding of coarse and fine drive provided by Example 1 to Example 4 of the disclosure.

Figure 7:
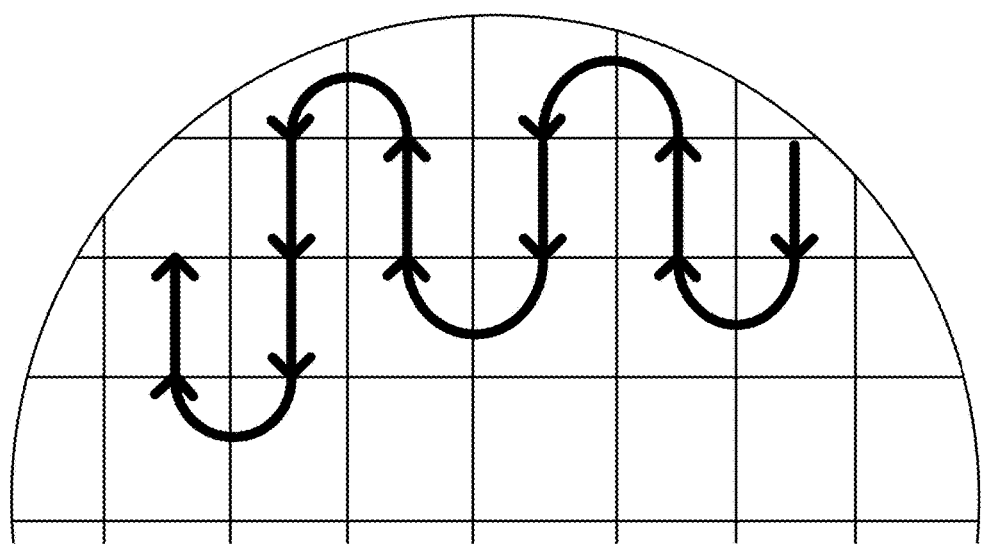
FIG. 7 is a path planning diagram of a semiconductor processing process in a preferred embodiment of the disclosure.

In semiconductor processing, the workbench usually moves along the trajectory shown in FIG. 7. The path is mainly divided into a uniform-speed linear motion stage and an acceleration and deceleration motion stage. The actual processing stage of the workbench is the uniform-speed linear stage, and the speed-changing motion stage is usually not used for processing operations due to the low control precision.

The advantage of the planar motor of the disclosure is that in the non-uniform-speed linear stage, the large driving force/torque generated by the second winding 7 may be used to perform acceleration and deceleration motions, and in the uniform-speed linear stage, the low ripple driving force/torque generated by the first winding 6 may be used to perform uniform-speed linear motion to reduce the temperature rise of the system and improve the positioning precision of the system.

At the same time, according to Maxwell's equations, it may be known that the Lorentz force $\vec{F}$ generated by a current-carrying conductor with a volume of V and a current density vector of $\vec{J}$ in a magnetic field with a magnetic field intensity of $\vec{B}$ is:

$$\vec{F} = \int_V \vec{J} \times \vec{B} dV \tag{2}$$

The driving torque around each axis may be obtained by multiplying the driving force and the lever arm $\vec{r}$, that is:

$$\vec{T} = \int_V \vec{r} \times (\vec{J} \times \vec{B}) dV \tag{3}$$

The driving force $\vec{F}$ and driving torque $\vec{T}$ actually required in the control process are decoupled by the host computer and then the output current of each coil driver is controlled.

The magnetic field intensity $\vec{B}$ varies with the position of the current-carrying conductor in the coil.

It may be seen from Formula (3) that only when the magnetic field intensity $\vec{B}$ is calculated accurately can the current density $\vec{J}$ actually required be obtained according to the expected force and expected torque.

In order to achieve analytical calculation of the Lorentz force, generally, the magnetic field is modeled using the Fourier series method.

According to the Fourier series method, the magnetic field intensity $\vec{B}$ is obtained by adding the fundamental wave $\vec{B_1}$ and each order of harmonic wave $\vec{B_n}$ (n>1), that is:

$$\vec{B} = \sum_{n=1}^{\infty} \vec{B_n} \tag{4}$$

However, in actual control, due to the performance limitation of the processor, in order to increase the control frequency, the fundamental component $\vec{B_1}$ of the magnetic field intensity is usually used to replace the magnetic field intensity $\vec{B}$. At this time, the actual driving force $\vec{F_1}$ generated is:

$$\vec{F_1} = \int_V \vec{J} \times \vec{B_1} dV \tag{5}$$

The actual driving torque $\vec{T_1}$ is:

$$\vec{T_1} = \int_V \vec{r} \times (\vec{J} \times \vec{B_1}) dV \tag{6}$$

There is a difference between the actual driving force $\vec{F_1}$ and the expected driving force $\vec{F}$, resulting in thrust fluctuation.

Therefore, if the harmonic content of each order when n is greater than 1 is reduced, the theoretical Lorentz force $\vec{F}$ and the actual Lorentz force $\vec{F_1}$ may be closer, thereby the driving force/torque fluctuations can be effectively reduced and the positioning precision and motion performance of the magnetic levitation planar motor are improved.

Figure 8:
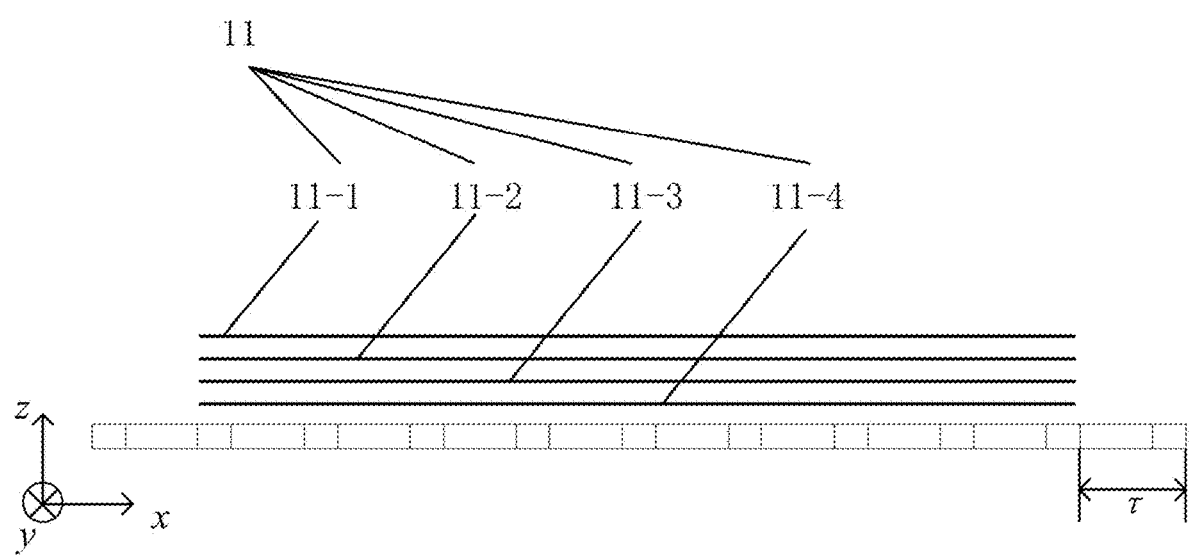
FIG. 8 is a side view of a permanent magnet array structure and auxiliary lines in an embodiment of the disclosure.
Figure 9A:
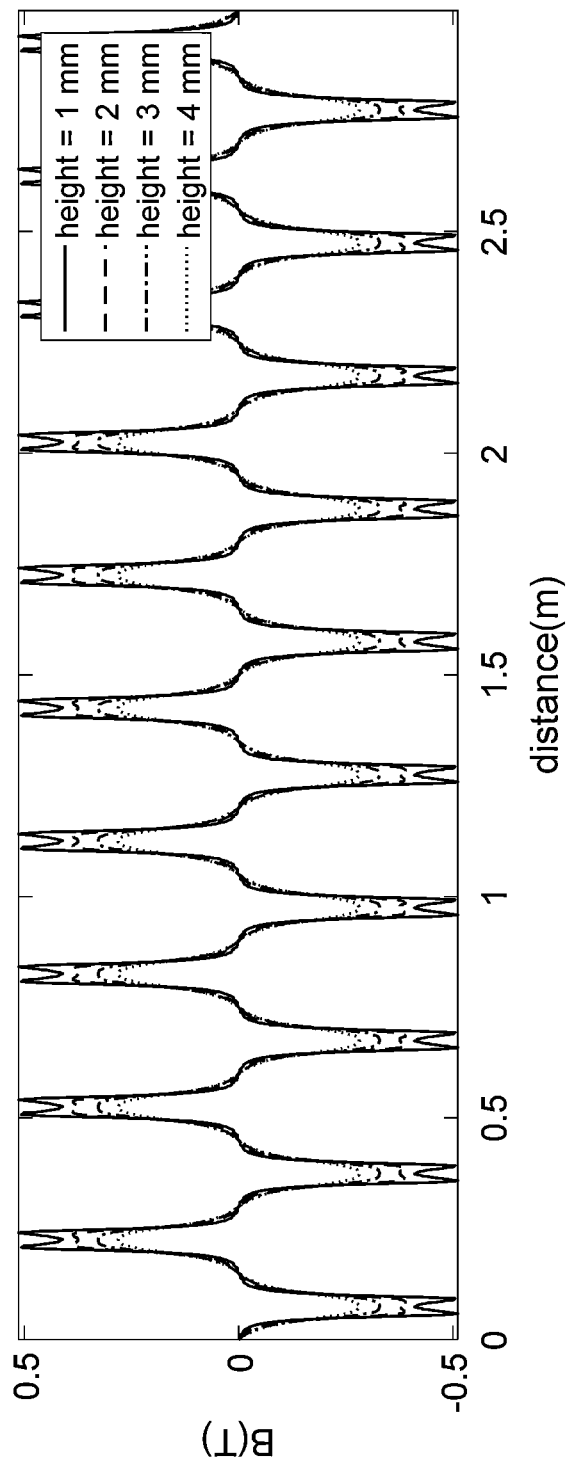
FIG. 9A is a diagram showing a horizontal component of a magnetic field intensity in an air gap magnetic field in a preferred embodiment of the disclosure.
Figure 9B:
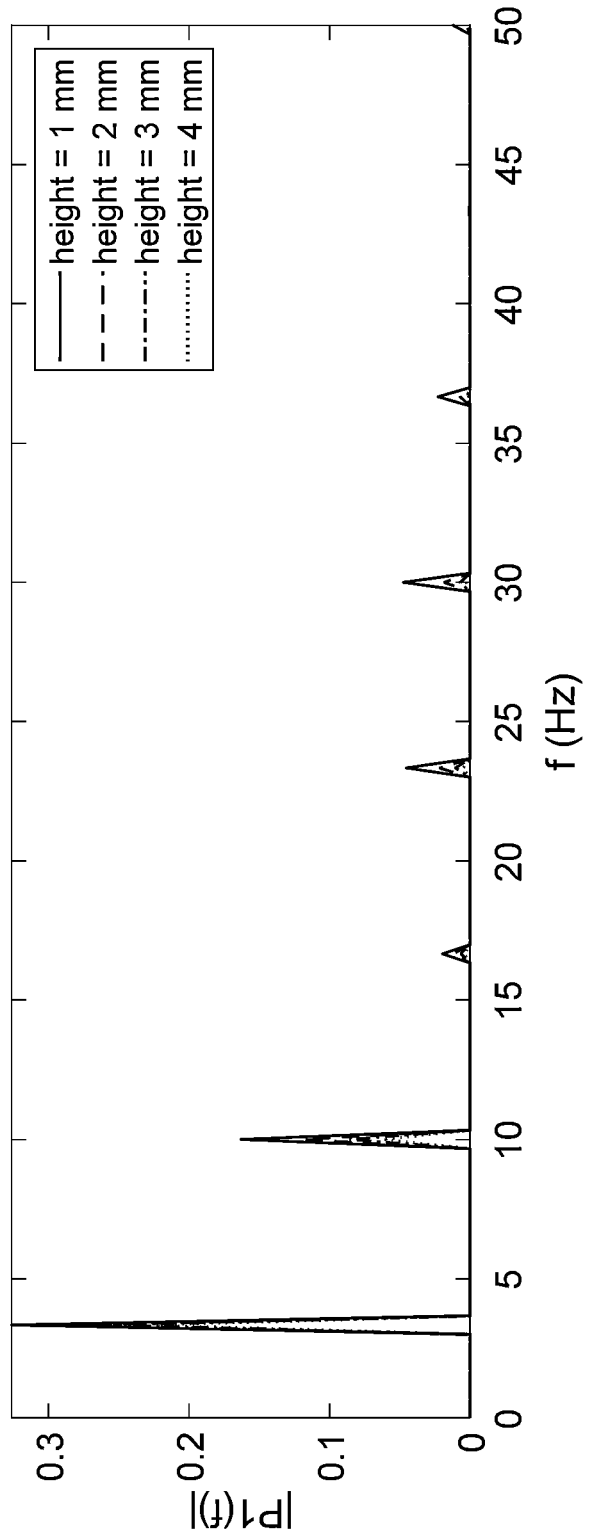
FIG. 9B is a spectrum diagram of the horizontal component of the magnetic field intensity after FFT transformation in a preferred embodiment of the disclosure.
Figure 10A:
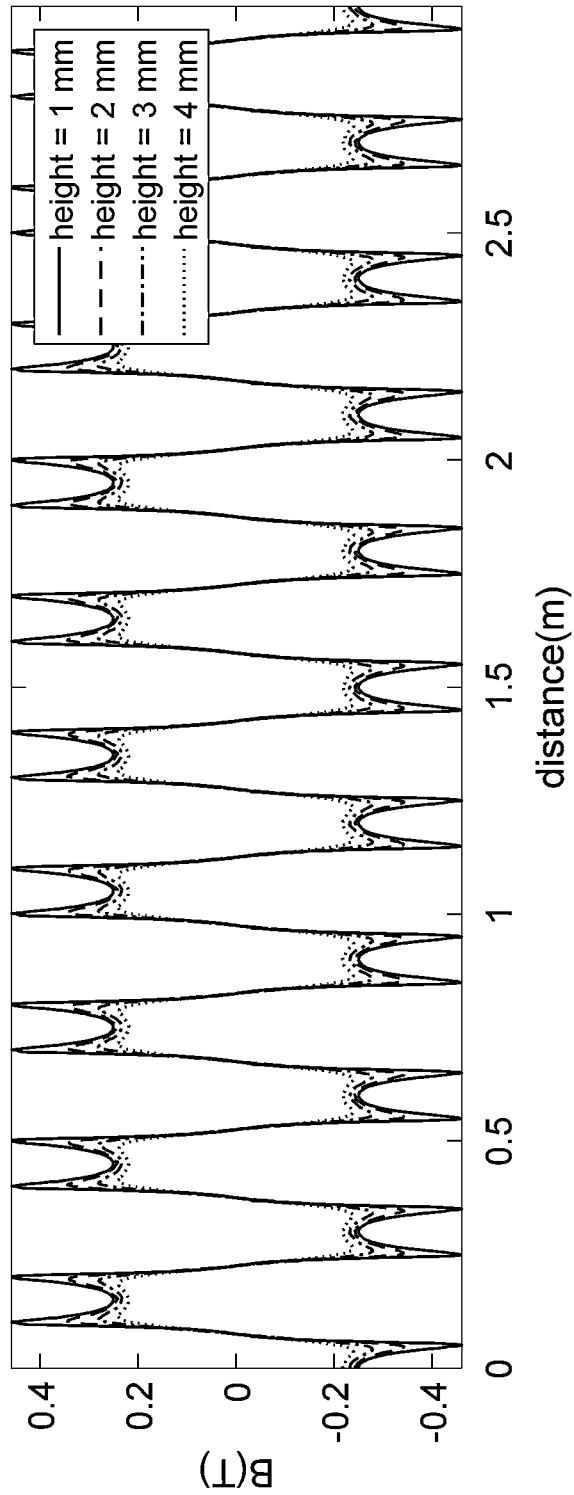
FIG. 10A is a diagram showing a vertical component of the magnetic field intensity in the air gap magnetic field in a preferred embodiment of the disclosure.
Figure 10B:
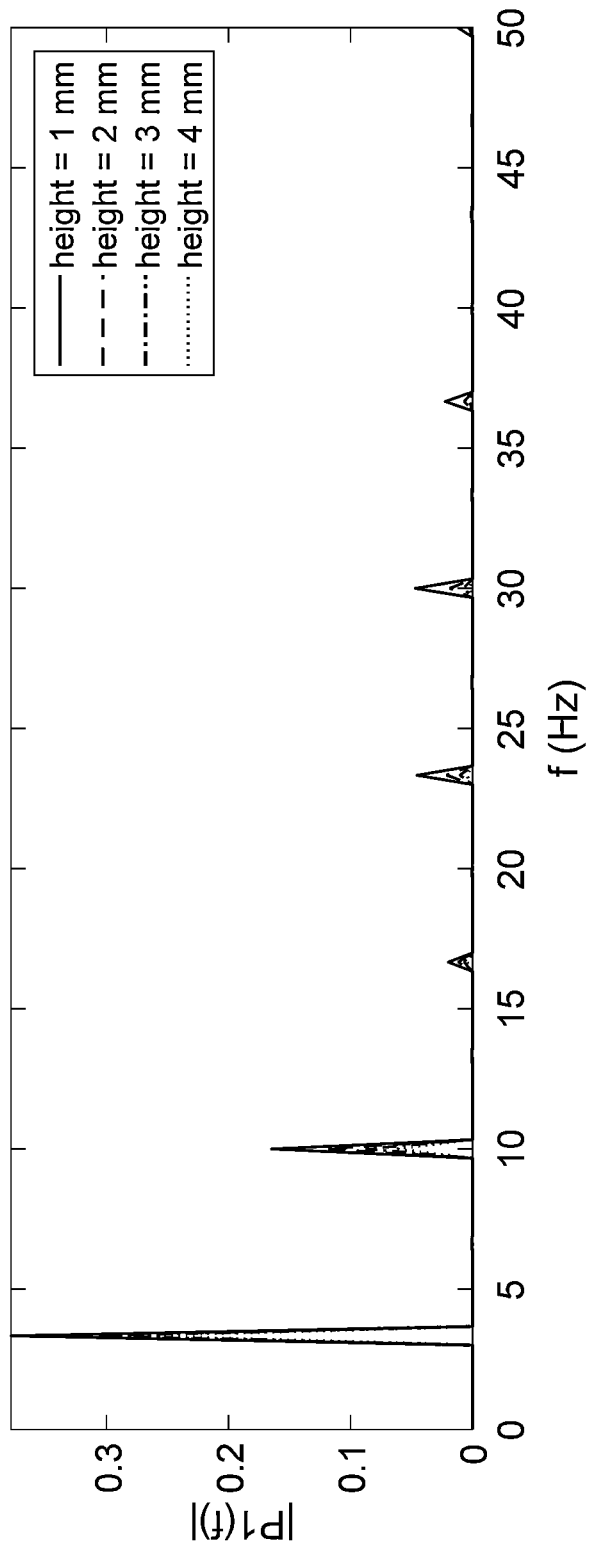
FIG. 10B is a spectrum diagram of the vertical component of the magnetic field intensity after FFT transformation in a preferred embodiment of the disclosure.

In order to better verify the implementation effect of the disclosure, auxiliary lines 11 are arranged in a direction parallel to the x axis. Specifically, four auxiliary lines 11-1, 11-2, 11-3, and 11-4 are arranged at equal intervals of 1 mm, and the lengths are all 10 times the magnetic pitch τ, the first auxiliary line 11-1 is 1 mm away from the upper surface of the permanent magnet, and the fourth auxiliary line 11-4 is 5 mm away from the upper surface of the permanent magnet, as shown in FIG. 8.

At this time, there is no magnetic field component in y direction on each line segment, there are only magnetic field components $\vec{B_x}$ and $\vec{B_z}$ in x and z directions, the components of the magnetic field in each direction are calculated and FFT transformation is performed, as shown in FIG. 9A, FIG. 9B, FIG. 10A, and FIG. 10B. It may be seen that with the increase of air gap, the amplitudes of fundamental wave and harmonic wave are decreased.

In order to quantitatively analyze the proportion of magnetic field harmonic waves at different heights, the concept of total harmonic distortion (THD) is introduced as follows:

$$THD = \frac{\sum_{n=2}^{\infty}\sqrt{|\vec{B_n}|^2}}{|\vec{B_1}|} \tag{7}$$

Figure 11:
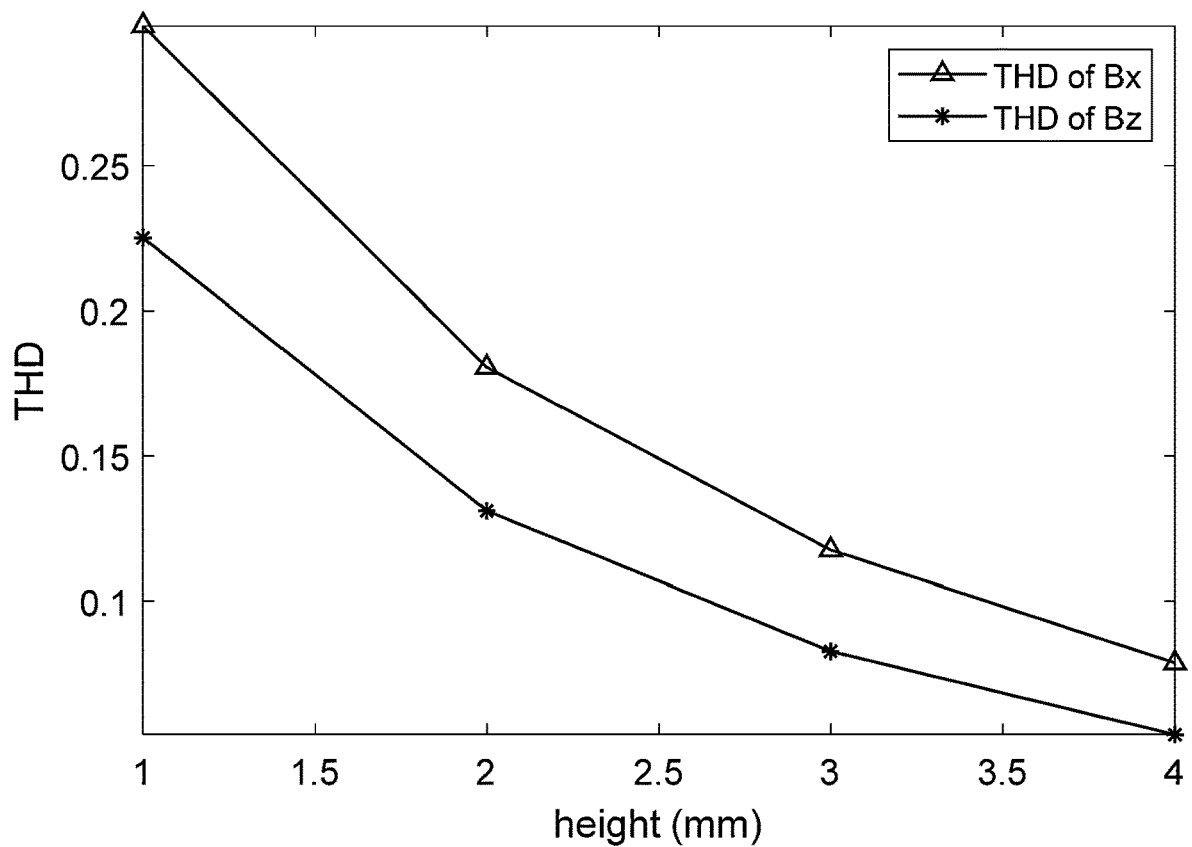
FIG. 11 is a diagram showing total harmonic distortion of the magnetic field intensity at different heights in the air gap magnetic field in a preferred embodiment of the disclosure.

The results of calculating the THD of the magnetic fields in each direction on each line segment are shown in FIG. 11. As the air gap height is increased from 1 mm to 4 mm, the THD of $\vec{B_x}$ and $\vec{B_z}$ on the auxiliary lines are decreased significantly.

Figure 12:
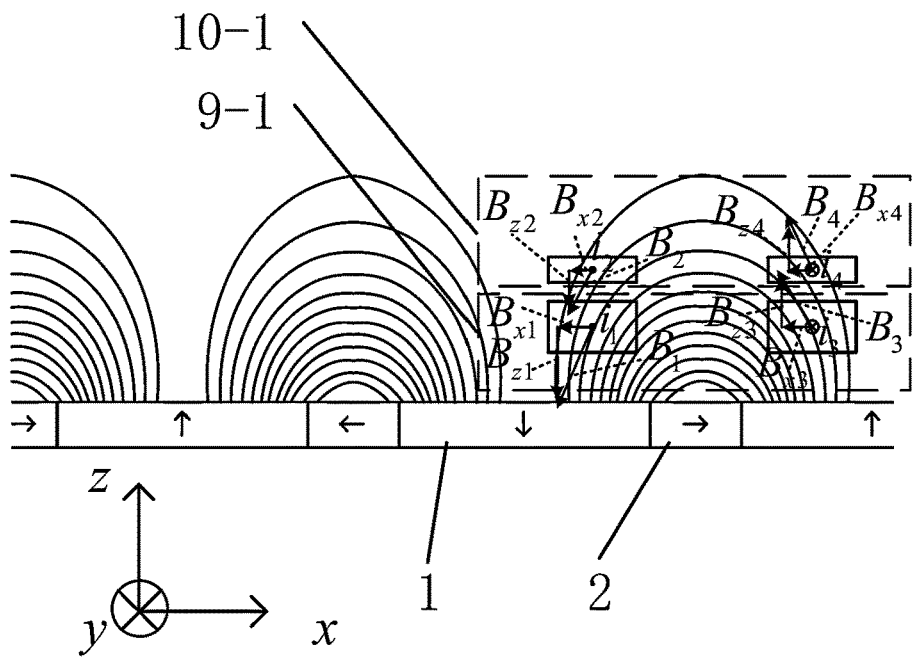
FIG. 12 is a side view of a magnetic levitation planar motor with a double-layer winding of coarse and fine drive in a preferred embodiment of the disclosure.

In order to clearly illustrate how the Lorentz force is generated, FIG. 12 is a side view of the magnetic levitation planar motor, from which it may be seen that the upper coil and the lower coil are all located on the enhanced side of the air gap magnetic field.

The surface current density vectors on the sections of the first coil 9-1 are respectively $\vec{i_1}$ and $\vec{i_3}$, with equal magnitudes and opposite directions. The surface current density vectors on the section of the fourth coil 10-1 are respectively $\vec{i_2}$ and $\vec{i_4}$, with equal magnitudes and opposite directions.

According to the left-hand rule, the horizontal force along the x axis generated by the first coil 9-1 in the magnetic field is:

$$\vec{F_{x9}} = \vec{F_{x1}} + \vec{F_{x3}} = \vec{B_{z1}}\cdot\vec{i_1}\cdot l + \vec{B_{z3}}\cdot\vec{i_3}\cdot l \tag{8}$$

The vertical force along the z axis is:

$$\vec{F_{z9}} = \vec{F_{z1}} + \vec{F_{z3}} = \vec{B_{x1}}\cdot\vec{i_1}\cdot l + \vec{B_{x3}}\cdot\vec{i_3}\cdot l \tag{9}$$

The horizontal force along the x axis generated by the fourth coil 10-1 in the magnetic field is:

$$\vec{F_{x10}} = \vec{F_{x2}} + \vec{F_{x4}} = \vec{B_{z2}}\cdot\vec{i_2}\cdot l + \vec{B_{z4}}\cdot\vec{i_4}\cdot l \tag{10}$$

The vertical force along the z axis is:

$$\vec{F_{z10}} = \vec{F_{z2}} + \vec{F_{z4}} = \vec{B_{x2}}\cdot\vec{i_2}\cdot l + \vec{B_{x4}}\cdot\vec{i_4}\cdot l \tag{11}$$

In the formula, $\vec{B_{x1}}$, $\vec{B_{x2}}$, $\vec{B_{x3}}$, and $\vec{B_{x4}}$ are respectively the magnetic field intensity vectors at the current-carrying conductors $\vec{i_1}$, $\vec{i_2}$, $\vec{i_3}$, and $\vec{i_4}$, and l is the equivalent length of the long sides of the first coil 9-1 and the fourth coil 10-1.

Assuming that the influence of the short side of the coil is ignored, and at the same time, since the current directions of the first coil 9-1 and the fourth coil 10-1 are the same as the y axis, there is no horizontal force $\vec{F_y}$ along the y axis.

Together with FIG. 11, it may be known that when the planar motor workbench of the disclosure is working, the coil thickness in the lower second winding 7 is relatively large, which facilitates the generation of a relatively large driving force and driving torque in the speed-changing motion stage, thereby high-speed motion is achieved. At the same time, as the air gap height increases, the total harmonic distortion of the magnetic field in each direction becomes smaller and smaller, the driving force/torque generated by the coil in the upper first winding 6 fluctuate less, which is beneficial to achieving the goal of high-precision motion control in the uniform-speed motion stage.

It should be easily understood by persons skilled in the art that the above description is only preferred embodiments of the disclosure and the embodiments are not intended to limit the disclosure. Any modifications, equivalent substitutions, and improvements made within the spirit and principles of the disclosure should be included in the protection scope of the disclosure.

What is claimed is:

1. A magnetic levitation planar motor workbench having a double-layer winding of coarse and fine drive, wherein the workbench comprises a stator (4) and a mover (8), wherein the stator (4) comprises a base (3), and a plurality of vertically magnetized permanent magnets (1) and a plurality of horizontally magnetized permanent magnets (2) arranged in a groove of the base (3) in a Halbach arrangement;

the mover (8) is located on an enhanced side of a magnetic field generated by the stator (4); the mover (8) comprises a first winding (6) and a second winding (7) stacked under the first winding (6), and a height of the first winding (6) is less than a height of the second winding (7); both the first winding (6) and the second winding (7) comprise a plurality of coils generating driving forces in two directions after being energized, so that the first winding (6) and the second winding (7) each have a six-degree-of-freedom driving force and a driving torque; a contour shape of the mover (8) is in a square shape or a semi-square shape.

2. The magnetic levitation planar motor workbench having the double-layer winding of coarse and fine drive as claimed in claim 1, wherein a height ratio of the first winding (6) to the second winding (7) is range from 0.2 to 0.6.

3. The magnetic levitation planar motor workbench having the double-layer winding of coarse and fine drive as claimed in claim 1, wherein the first winding (6) comprises four groups of first single-phase windings arranged in 2 rows and 2 columns, the first single-phase winding comprises a rectangular coils arranged in parallel at equal intervals, and long sides of the rectangular coils of every two adjacent groups of first single-phase windings are perpendicular to each other;

the second winding (7) has same structure as the first winding (6) and differs only in height, and the rectangular coils in the first winding (6) and rectangular coils in the second winding (7) are stacked up and down in a one-to-one correspondence.

4. The magnetic levitation planar motor workbench having the double-layer winding of coarse and fine drive as claimed in claim 3, wherein the long sides of the rectangular coils in the first winding (6) and the second winding (7) are all at an angle of 45°±1° to catheti of the vertically magnetized permanent magnets (1).

5. The magnetic levitation planar motor workbench having the double-layer winding of coarse and fine drive as claimed in claim 3, wherein in the first single-phase winding, a length of the long side of the rectangular coil is four times a pole pitch, and a center distance between adjacent rectangular coils is 4/3 times the pole pitch.

6. The magnetic levitation planar motor workbench having the double-layer winding of coarse and fine drive as claimed in claim 1, wherein the first winding (6) comprises three groups of second single-phase windings, and the second single-phase winding comprises b rectangular coils sequentially stacked in a step-shape manner, one of the groups of the second single-phase windings is placed flat in middle, and the other two groups of the second single-phase windings are respectively placed vertically at upper left and lower right steps of the second single-phase winding in middle and are attached with step connections of the second single-phase winding in middle;

the second winding (7) has same structure as the first winding (6) but differs in height, and an orientation of the first winding (6) rotated 90° Counterclockwise around a center thereof is an orientation of the second winding (7).

7. The magnetic levitation planar motor workbench having the double-layer winding of coarse and fine drive as claimed in claim 1, wherein the first winding (6) comprises c rows, each of the rows has d rectangular coils, short sides of adjacent rectangular coils in each of the rows are connected, and adjacent rows are staggered left and right;

the second winding (7) has same structure as the first winding (6) but differs in height, and long sides of the rectangular coils in the first winding (6) and long sides of the rectangular coils in the second winding (7) are perpendicular to each other.

8. The magnetic levitation planar motor workbench having the double-layer winding of coarse and fine drive as claimed in claim 1, wherein both the first winding (6) and the second winding (7) comprise circular coils in e rows and e columns, and the circular coils in the first winding (6) and the second winding (7) are stacked up and down in concentric circles in a one-to-one correspondence.

9. The magnetic levitation planar motor workbench having the double-layer winding of coarse and fine drive as claimed in claim 1, wherein the workbench further comprises a vacuum cover, and the mover (8) is disposed inside the vacuum cover.

10. The magnetic levitation planar motor workbench having the double-layer winding of coarse and fine drive as claimed in claim 1, wherein the vertically magnetized permanent magnet (1) is in a square shape, and the horizontally magnetized permanent magnet (2) is in a rectangular shape.

\* \* \* \* \*